United States Patent

Maeda et al.

Patent Number: 6,079,610
Date of Patent: Jun. 27, 2000

[54] WIRE BONDING METHOD

[75] Inventors: Yukihiro Maeda, Kasugai; Takashi Nagasaka, Anjo; Toshio Suzuki, Toyokawa, all of Japan

[73] Assignee: Denso Corporation, Kariya, Japan

[21] Appl. No.: 08/944,822

[22] Filed: Oct. 6, 1997

[30] Foreign Application Priority Data

Oct. 7, 1996 [JP] Japan ................................. 8-266372

[51] Int. Cl.[7] .......................... B23K 31/00; B23K 31/02; B23K 1/06; B23K 5/20
[52] U.S. Cl. .................... 228/180.5; 228/110.1; 228/180.22
[58] Field of Search .................. 228/180.5, 110.1, 228/180.22, 4.5

[56] References Cited

U.S. PATENT DOCUMENTS

| | | | |
|---|---|---|---|
| 4,442,967 | 4/1984 | van de Pas et al. | 228/159 |
| 5,090,119 | 2/1992 | Tsuda et al. | 29/843 |
| 5,172,851 | 12/1992 | Matsushita et al. | 228/179 |
| 5,299,729 | 4/1994 | Matsushita et al. | 228/180.22 |
| 5,328,079 | 7/1994 | Mathew et al. | 228/180.5 |
| 5,364,009 | 11/1994 | Takahashi et al. | 228/110.1 |
| 5,485,949 | 1/1996 | Tomura et al. | 228/180.5 |
| 5,842,628 | 12/1998 | Nomoto et al. | 228/180.5 |

FOREIGN PATENT DOCUMENTS

| | | |
|---|---|---|
| 62-115748 | 5/1987 | Japan . |
| 1-293626 | 11/1989 | Japan . |
| 2-012919 | 1/1990 | Japan . |
| 2-086132 | 3/1990 | Japan . |
| 2-114545 | 4/1990 | Japan . |
| 3-044050 | 2/1991 | Japan . |
| 3-066130 | 3/1991 | Japan . |
| 3-183139 | 8/1991 | Japan . |
| 4-123434 | 4/1992 | Japan . |
| 4-127546 | 4/1992 | Japan . |
| 4-130633 | 5/1992 | Japan . |
| 4-294552 | 10/1992 | Japan . |
| 5-211192 | 8/1993 | Japan . |
| 5-243234 | 9/1993 | Japan . |
| B2-7-70559 | 7/1995 | Japan . |
| B2-7-93305 | 10/1995 | Japan . |

*Primary Examiner*—Patrick Ryan
*Assistant Examiner*—Kiley Stoner
*Attorney, Agent, or Firm*—Pillsbury Madison & Sutro LLP

[57] ABSTRACT

A ball is formed at the tip of a wire projecting from a capillary. The capillary is positioned above an interconnection, and ball bonding forms a bump on the interconnection. The capillary is then moved next to the bump and wedge bonding is carried out. Next, the capillary is moved upward and another ball is formed at the tip of the wire, and the wire is primary bonded to a bonding pad of a semiconductor chip. The wire is then looped and the capillary is positioned above the bump, and secondary bonding is carried out. As a result, the formation of tails on the bump is prevented.

13 Claims, 6 Drawing Sheets

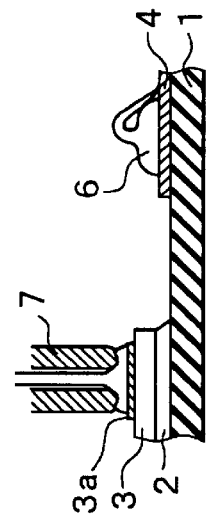
FIG. 2A
FIG. 2B
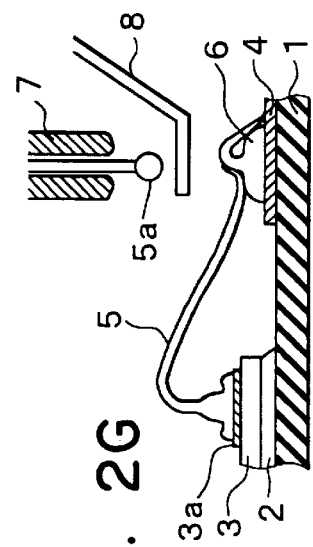
FIG. 2C
FIG. 2D
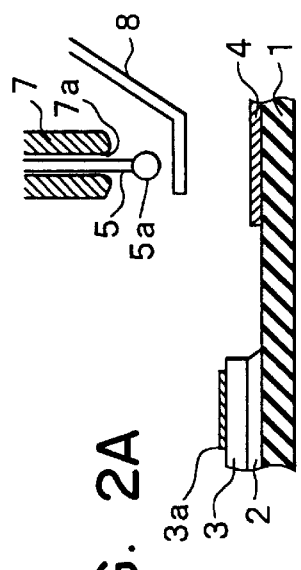
FIG. 2E
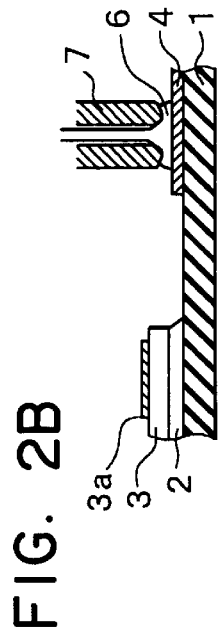
FIG. 2F
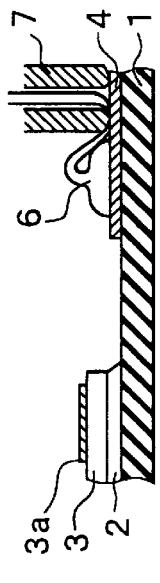
FIG. 2G

FIG. 5A

| LT | US PARALLEL (0°) PT | | | |
|---|---|---|---|---|
| | 100 | 125 | 150 | 175 |
| 0 | 0/40 | 0/40 | 0/40 | 0/40 |
| | 0/40 | 0/40 | 0/40 | 0/40 |
| 10 | 0/40 | 0/40 | 0/40 | 0/40 |
| | 7/40 | 0/40 | 0/40 | 0/40 |
| 20 | | 0/40 | 0/40 | 0/40 |
| | | 0/40 | 0/40 | 0/40 |
| 30 | | 0/40 | 0/40 | 0/40 |
| | | 4/40 | 0/40 | 0/40 |

FIG. 5B

| LT | US ORTHOGONAL (0°) PT | | | |
|---|---|---|---|---|
| | 100 | 125 | 150 | 175 |
| 0 | 0/40 | 0/40 | 0/40 | 0/40 |
| | 1/40 | 0/40 | 0/40 | 0/40 |
| 10 | 0/40 | 0/40 | 0/40 | 0/40 |
| | 0/40 | 0/40 | 0/40 | 0/40 |
| 20 | 0/40 | 0/40 | 0/40 | 0/40 |
| | 0/40 | 0/40 | 0/40 | 0/40 |
| 30 | 2/40 | 0/40 | 0/40 | 1/40 |
| | 2/40 | 1/40 | 0/40 | 1/40 |

FIG. 5C

| LT | US PARALLEL (45°) PT | | | |
|---|---|---|---|---|
| | 125 | 150 | 175 | |
| 0 | 0/40 | 0/40 | 0/40 | |
| | 0/40 | 0/40 | 0/40 | |
| 10 | 0/40 | 0/40 | 0/40 | |
| | 0/40 | 0/40 | 0/40 | |
| 20 | 0/40 | 0/40 | 0/40 | |
| | 0/40 | 0/40 | 0/40 | |
| 30 | 0/40 | 0/40 | 0/40 | |
| | 0/40 | 0/40 | 0/40 | |

FIG. 5D

| LT | US ORTHOGONAL (45°) PT | | | |
|---|---|---|---|---|
| | 125 | 150 | 175 | |
| 0 | 0/40 | 0/40 | 0/40 | |
| | 0/40 | 0/40 | 0/40 | |
| 10 | 0/40 | 0/40 | 0/40 | |
| | 0/40 | 0/40 | 0/40 | |
| 20 | 0/40 | 0/40 | 0/40 | |
| | 0/40 | 0/40 | 0/40 | |
| 30 | 0/40 | 0/40 | 0/40 | |
| | 0/40 | 0/40 | 0/40 | |

WIRE BONDING METHOD

CROSS REFERENCE TO RELATED APPLICATION

This application is based upon and claims the benefit of priority of prior Japanese Patent Application No. H. 8-266372 filed on Oct. 7, 1996, the contents of which are incorporated herein by reference.

BACKGROUND OF THE INVENTION

1. Field of the Invention

This invention relates to a wire bonding method for carrying out wire bonding between two conductors.

2. Related Art

To carry out wire bonding between a semiconductor chip and an interconnection, a capillary having an Au wire passing through it is normally used. First, a ball is formed at the tip of the Au wire projecting from the capillary by electric discharge from a torch electrode, and then the capillary is positioned above the semiconductor chip and primary bonding is carried out. After that, the capillary is moved to above the interconnection and secondary bonding is carried out. The semiconductor chip and the interconnection are thereby wire bonded together.

In this case, when the interconnection material is a material whose bondability with Au wire is poor, for example, Cu, Ni or flash Au plating, it is not possible to carry out direct bonding onto the interconnection. For this reason, a substrate of Ag plating or thick Au plating or the like is formed in advance on the area onto which bonding is to be carried out.

However, providing this kind of substrate is not preferable in practice, and a method which makes it possible to carry out direct bonding onto an interconnection even when the interconnection material is one whose bondability with Au wire is poor has been being sought.

Japanese Patent Application Laid-open No. 3-183139 discloses a method wherein wire bonding between a semiconductor chip and an interconnection is carried out by forming a bump on the interconnection in advance by carrying out ball bonding, performing primary bonding onto the semiconductor chip, and then performing secondary bonding onto the bump. With this method, as a result of the bump being formed, it is possible to carry out direct bonding onto an interconnection even when the interconnection material is one whose bondability with Au wire is poor.

However, in this method, when ball bonding is carried out to form the bump, the Au wire is cut from the bump by being pulled upward. Consequently, as shown in FIG. 7A, a tail A forms on the bump 6. Also, when secondary bonding to the bump 6 is carried out, it sometimes happens that as a result of the Au wire 5 being bonded to the tail A on the bump 6, an even larger tail B forms, as shown in FIG. 7B.

When these kinds of tails A and B form, if the tails A, B break, there is a possibility of a short circuit with another interconnection. Also, when the Au wire 5 is bonded to the tail A, as shown in FIG. 7B, the Au wire 5 is cut by being pulled upward. Consequently, dispersion arises in the position at which the Au wire 5 is cut and dispersion arises in the length of the Au wire projecting from the capillary. Since, as described above a ball is formed at the tip of the Au wire by electric discharge between the tip of the Au wire projecting from the capillary and a torch electrode, when there is dispersion in the length of the Au wire projecting from the capillary, dispersion also arises in the diameter of the ball formed at the tip of the Au wire. As a result, the bond strength of wire bonding subsequently carried out changes. Also, when cutting so that no Au wire projects from the capillary no electric discharge occurs between the Au wire and the torch electrode. In a wire bonding apparatus, the electric discharge state of the apparatus is monitored, and when no electric discharge occurs between the Au wire and the torch electrode the apparatus stops.

Thus, the formation of the above-mentioned tails A, B causes various problems.

SUMMARY OF THE INVENTION

It is therefore an object of the invention to provide a wire bonding method with which it is possible to bond a wire directly to a conductor and suppress the formation of the above-mentioned tails.

To achieve the above-mentioned object and other objects, in the present invention, a ball formed at the tip of a wire is ball-bonded onto a second conductor to form a bump. The wire extending from this bump is cut by being wedge-bonded to the bump or to the second conductor. After that, primary bonding to a first conductor is carried out, and then, the wire from the first conductor side is looped to the bump and secondary bonding of this wire to the bump is carried out. By this method, the first conductor and the second conductor are wire-bonded together.

In the above-mentioned method, because after the bump is formed the wire extending from the bump is wedge-bonded to the bump or to the second conductor, formation of the kind of tail shown in FIG. 7A is suppressed. As a result of this, when secondary bonding to the bump is carried out, formation of the kind of tail shown in FIG. 7B is suppressed.

Preferably, the wedge bonding is carried out at a distance of at least 125 μm and no more than 175 μm from the center of the bump, and the secondary bonding is carried out at a distance of from 0 μm to 20 μm from the center of the bump.

By adopting this setting, as shown in results in FIGS. 5A through 5D, which will be discussed later, it is possible to obtain very good results with respect to problems, such as the tail formation.

Further, it is possible to maintain good results with respect to problems, such as tail information, the wedge bonding is carried out on the opposite side of the bump from the first conductor and at an angle from the center of the bump within the range of ±90°, and more preferably ±45° with respect to a direction in which the looping is made.

BRIEF DESCRIPTION OF THE DRAWINGS

These and other objects, features and characteristics of the present invention will be appreciated from a study of the following detailed description, the appended claims, and drawings, all of which form a part of this application. In the drawings:

FIGS. 2A through 2G are process views showing a wire bonding process of an embodiment of the present invention;

FIGS. 5A through 5D are tables showing results of tail formation frequency and wire bonding apparatus stoppage frequency;

DETAILED DESCRIPTION OF THE CURRENTLY PREFERRED EMBODIMENT OF THE INVENTION

Figure 1:
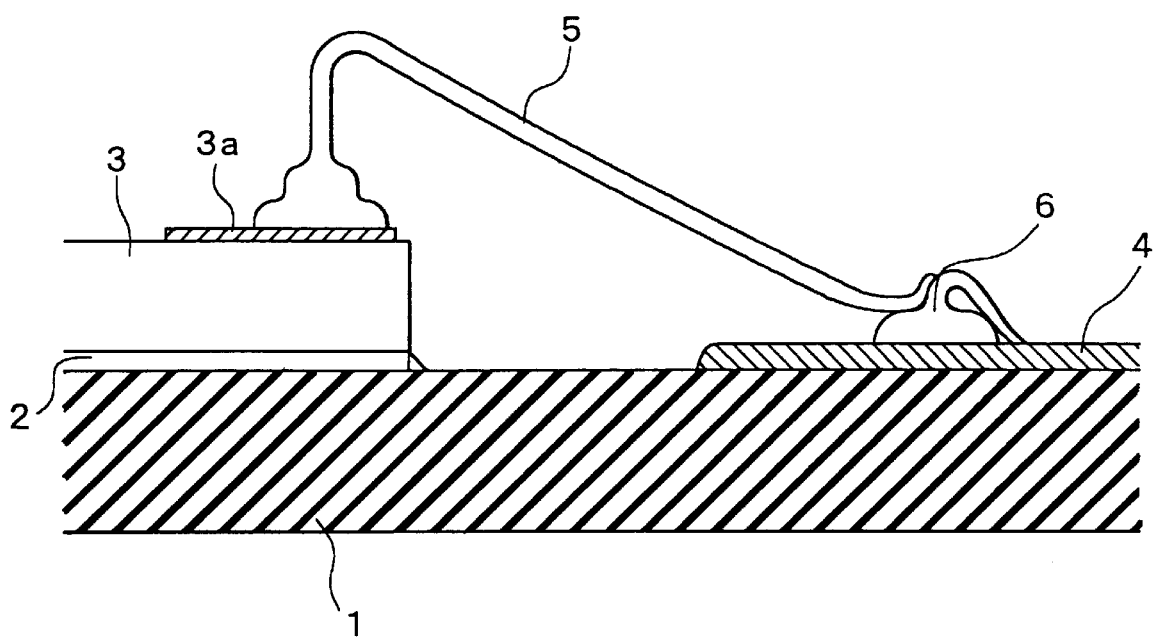
FIG. 1 is a sectional view showing a semiconductor chip and an interconnection wire-bonded together using a wire bonding method of an embodiment of the present invention.

FIG. 1 shows a semiconductor chip and an interconnection wire-bonded together using a wire bonding method of an embodiment of the present invention.

A semiconductor chip 3 is die-mounted on a circuit board (a board such as a ceramic board or a printed board, or a lead frame) 1 by die-mounting paste 2. Also, an interconnection 4 made using an interconnection material, such as Cu, Ni, an interconnection conductor using Cu or Ni as a primary material (Cu thick film, Cu plating, Ni thick film, Ni plating and the like), or flash Au plating, whose bondability with an Au wire 5 is poor, is formed on the circuit board 1.

In this embodiment, when a bonding pad 3a of the semiconductor chip 3 and the interconnection 4 are to be wire-bonded using an Au wire 5, a bump 6 is formed in advance on the interconnection 4. After that, loop bonding is carried out between the bonding pad 3a of the semiconductor chip 3 and the bump 6.

A wire bonding method according to an embodiment of the present invention will now be described with reference to FIGS. 2A through 2G.

In FIG. 2A, with an Au wire 5 passed through the penetrating hole 7a of a capillary 7, a ball 5a is formed at the tip of the Au wire 5 projecting from the capillary 7 by electric discharge from a torch electrode 8.

In FIG. 2B, the capillary 7 is positioned above the interconnection 4 and ball bonding is carried out. A bump 6 is formed by this ball bonding.

In FIG. 2C, the capillary 7 is moved to behind the bump 6 (to side of the bump 6 opposite from the semiconductor chip 3) and wedge bonding is carried out. In this case, the Au wire 5 extending from the bump 6 is cut by the capillary 7 being pushed onto the interconnection 4.

In FIG. 2D, the capillary 7 is moved upward, and, by electric discharge from the torch electrode 8, a ball 5a is formed at the tip of the Au wire 5.

In FIG. 2E, the capillary 7 is positioned above the bonding pad 3a of the semiconductor chip 3, and primary bonding is carried out.

In the FIG. 2F, the Au wire 5 is looped and the capillary 7 is positioned above the bump 6, and secondary bonding is carried out. In this case, the center of the capillary 7 and the center of the bump 6 are aligned.

In FIG. 2G, the capillary 7 is moved upward, a ball 5a is formed at the tip of the Au wire 5 by electric discharge from the torch electrode 8, and the next wire bonding is commenced.

It is to be noted that, in the wire bonding method of this embodiment, an ultrasonic (US) wave is directed to the portions to be wire-bonded when each of bonding steps is carried out.

Figure 7A:
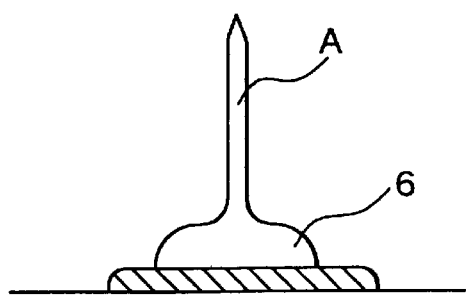
FIGS. 7A and 7B are views illustrating problems associated with the related art.

With the wire bonding method described above, after the bump 6 is formed by ball bonding, wedge bonding is carried out onto the interconnection 4 behind the bump 6. Therefore, the Au wire 5 extending from the bump 6 is bent to behind the bump 6 and the kind of tail A shown in FIG. 7A does not form.

Figure 3A:
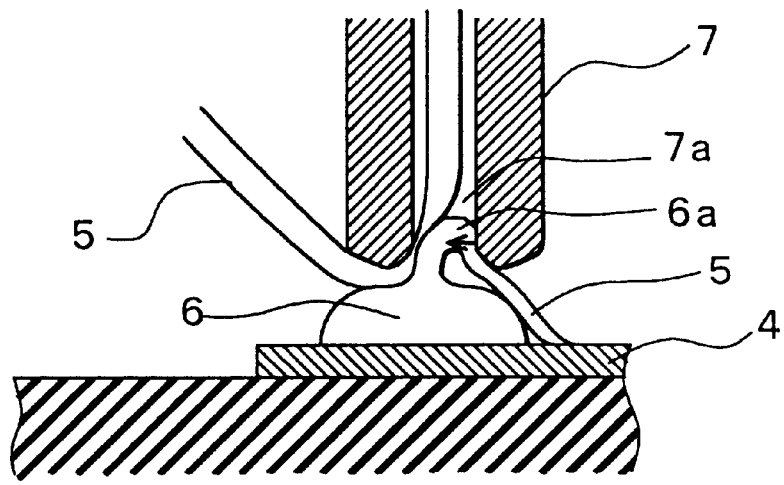
FIGS. 3A and 3B are views illustrating secondary bonding onto a bump 6.
Figure 3B:
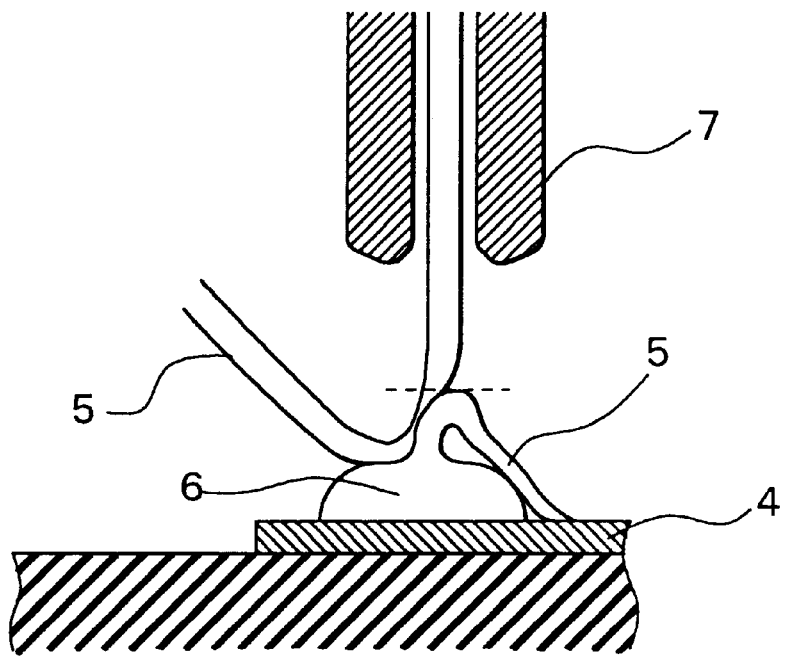

Also, when the secondary bonding is carried out onto the bump 6, as shown in FIG. 3A, the capillary 7 is positioned so that a bent portion 6a of the Au wire 5 extending from the bump 6 enters the hole 7a of the capillary 7. Then, because the bent portion 6a is pushed in the direction of the arrow in the figure by the inner wall of the hole 7a as a result of the movement of the capillary 7 toward the bump 6, the Au wire 5 and the bent portion 6a are bonded together with the Au wire 5 being squashed by the inner wall of the other side of the hole 7a. Then, when the capillary 7 is moved upward and the Au wire 5 is pulled, as shown in FIG. 3B, the Au wire 5 is cut at the position of the upper end of the bond portion to the bent portion 6a (the position shown with a broken line in the figure).

Figure 7B:
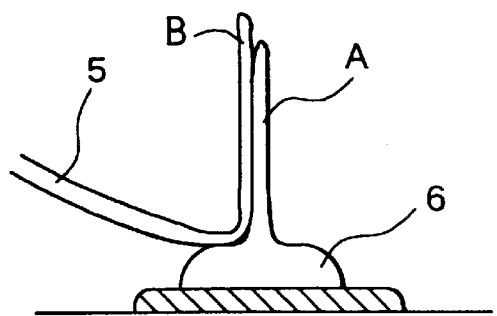

Therefore, a tail B of the kind shown in FIG. 7B does not form. Also, because the position at which the Au wire 5 is cut is substantially fixed at the position of the upper end of the bond portion, the length of the Au wire 5 projecting from the capillary 7 is also substantially fixed. As a result, when the next wire bonding is carried out (see the step of FIG. 2G), electric discharge from the torch electrode 8 can be affected correctly.

Next, details studied in order to carry out the wired bonding described above optimally will be discussed.

Figure 4A:
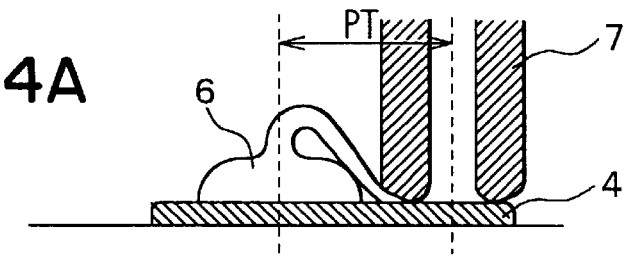
FIGS. 4A through 4D are views illustrating parameters studied for setting wire bonding conditions.
Figure 4B:
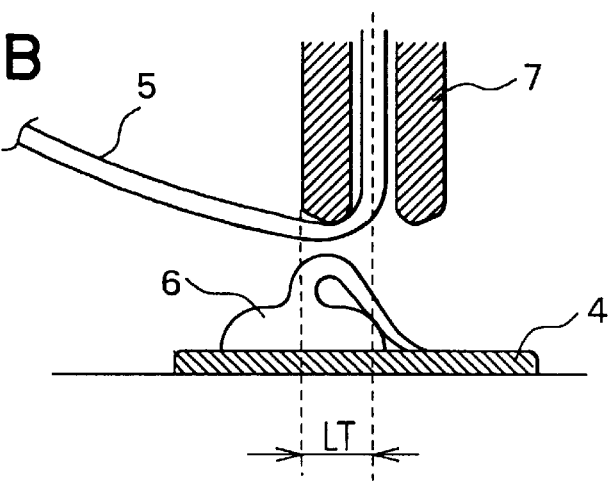
Figure 4C:
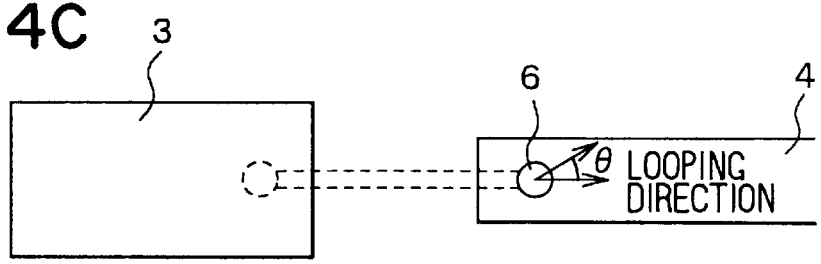
Figure 4D:
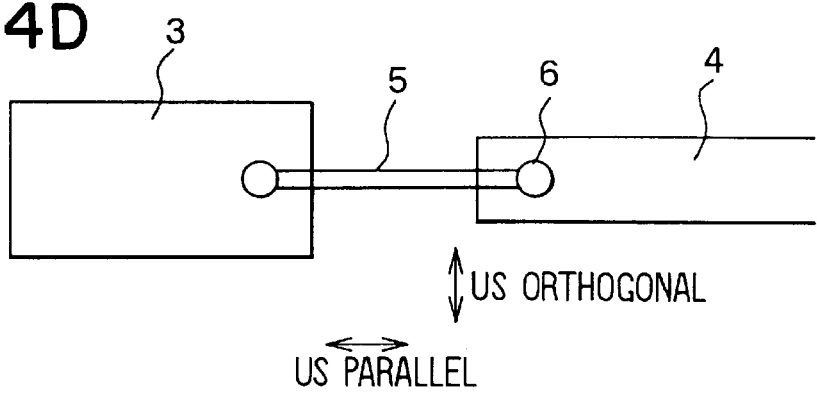

The parameters investigated were the distance PT (see FIG. 4A) between the center of the bump 6 and the center of the capillary 7 when carrying out wedge bonding, the distance LT (see FIG. 4B) between the center of the bump 6 and the center of the capillary 7 when carrying out secondary bonding, the angle θ (see FIG. 4C) of the wedge bonding direction with respect to the looping direction of the Au wire 5, and the direction of ultrasonic (US) wave (see FIG. 4D) with respect to the looping direction of the Au wire 5. FIGS. 4C and 4D are top views of the circuit board 1. As shown in FIG. 4D, the case wherein the ultrasonic wave impression direction is orthogonal to the looping direction will be called US orthogonal and the case wherein it is parallel to the looping direction will be called US parallel.

FIGS. 5A through 5D show results obtained in an experiment carried out to investigate the frequency of tail formation and the frequency of stoppage of the wire bonding apparatus with different values of PT and LT (units: μm) for each of the four combinations of the cases of the angle θ being made 0° and 45° and the cases of US orthogonal, and US parallel. The number of samples in each case was made forty, and the figures above the dotted lines in the tables show the number of instances of tail formation in the respective forty samples and the figures below the dotted lines show the number of stoppages of the wire bonding apparatus. When the Au wire was cut in the secondary bonding, it was checked visually whether or not the position of the cut was above the upper end of the bent portion 6a, and when the cut position was above the upper end of the bent portion 6a, it was deemed that a tail had formed.

In the parts of the tables shown with diagonal lines, either tail formation or wire bonding apparatus stoppage occurred. Thus, as can be seen from the results shown in FIGS. 5A and 5B, tail formation and wire bonding apparatus stoppages are eliminated by PT being at least 125 μm and no greater than 175 μm and LT being from 0 μm to 20 μm.

Also, even if the angle θ of the wedge bonding direction with respect to the looping direction is made large, at 45°, as shown in FIGS. 5C and 5D, if PT and LT are set in the above-mentioned ranges, it is possible to eliminate tail formation and wire bonding apparatus stoppages. Because negative angles give the same results, the same results can be obtained if the angle θ is no greater than ±45°.

Figure 6A:
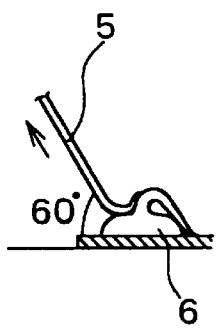
FIGS. 6A and 6B are views showing results of a one-side tensile strength test.
Figure 6B:
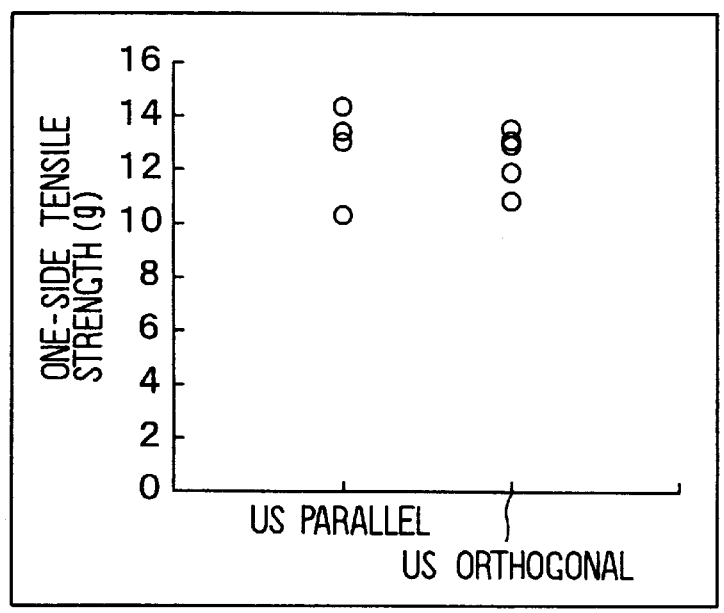

Results obtained when an one-side tensile strength test (a strength test wherein the Au wire 5 is pulled at 60° as shown in FIG. 6A) was carried out for the secondary bonding of the Au wire 5 to the bump 6 are shown in FIG. 6B. From these results, it can be seen that ample strength (the strength can be considered sufficient, if it is over 10 g) is obtained in the cases of both US parallel and US orthogonal.

In the embodiment described above, loop bonding is carried out immediately after a bump 6 is formed, but a predetermined number of bumps 6 may be formed first and then loop bonding of all these bumps 6 carried out thereafter.

Also, the invention can be applied not only to wire bonding between a semiconductor chip 3 and an interconnection 4 but also for example to wire bonding between two semiconductor chips or between two interconnections.

The materials of the wire and the interconnection may be other than those mentioned above, and the wire used for the ball bonding may be made a different material from the wire used for the loop bonding.

Also, although in the embodiment described above, the capillary 7 is pushed onto the interconnection 4 to cut the Au wire 5 extending from the bump 6, the Au wire 5 may alternatively be cut by pushing the capillary 7 onto the bump 6.

Also, the angle θ of the wedge bonding direction is not limited to the ±45° mentioned in the embodiment described above. Although there will be some difference in manufacturing yield, the wedge bonding may be carried out at any position around the bump 6 (θ=360°). A preferable range for the wedge bonding to be carried out is in the angular range of ±90° (θ=±90°) from the center of the bump 6 with respect to the looping direction of the Au wire 5, on the opposite side of the bump 6 from the bonding pad 3a.

While specific embodiments and variations of the present invention have been shown and described, further modifications and improvements will occur to those skilled in the art, and are to be encompassed by the appended claims. It should be understood that this invention is not limited to the particular forms shown and/or described. One skilled in the art will appreciate that the present invention can be practiced by other than the described embodiments, which are presented for purposes of illustration and not limitation, and the present invention is limited only by the claims that follow.

What is claimed is:

1. A wire bonding method for wire bonding a first conductor and a second conductor using a capillary having an wire passing through a penetrating hole formed therein, said wire bonding method comprising:

forming a bump on said second conductor by forming a ball at a tip of said wire projecting from said capillary and ball bonding of said ball to said second conductor;

moving said capillary laterally and pushing said wire onto one of said bump and said second conductor to form a bent portion extending from said bump to said one of said bump and said second conductor;

cutting said wire projecting from said capillary;

primary bonding said first conductor by said capillary;

moving said capillary with said wire, which is wire-bonded to said first conductor, toward said bent portion;

inserting said bent portion into said penetrating hole of said capillary; and bonding said wire protruding from said penetrating hole to said bent portion by an inner wall of said penetrating hole.

2. The wire bonding method as claimed an claim 1, wherein said wire is pushed onto one of said bump and said second conductor on a side of said bump opposite from said first conductor and at an angle from a center of said bump within a range of ±90° with respect to a direction in which said capillary is moved from said first conductor to said bump.

3. The wire bonding method as claimed in claim 1, wherein said wire is pushed onto one of said bump and said second conductor on a side of said bump opposite from said first conductor and at an angle from a center of said bump within a range of ±45° with respect to a direction in which said capillary is moved from said first conductor to said bump.

4. The wire bonding method as claimed in claim 1, wherein said wire is pushed onto one of said bump and said second conductor at a distance of at least 125 $\mu$m and no more than 175 $\mu$m from a center of said bump.

5. The wire bonding method as claimed in claim 4, wherein said secondary bonding is carried out at a distance from 0 $\mu$m to 20 $\mu$m from said center of said bump.

6. The wire bonding method as claimed in claim 5, wherein said wire is pushed onto one of said bump and said second conductor on a side of said bump opposite from said first conductor and at an angle from a center of said bump within a range of ±45° with respect to a direction in which said capillary is moved from said first conductor to said bump.

7. A wire bonding method for wire bonding a first conductor and a second conductor using a capillary having an wire passing through a penetrating hole formed therein, said wire bonding method comprising:

forming a bump on said second conductor by forming a ball at a tip of said wire projecting from said capillary and ball bonding of said ball to said second conductor;

cutting a wire extending from said bump by moving said capillary laterally and pushing said wire onto either said bump and said second conductor;

primary bonding said first conductor; and secondary bonding said second conductor by moving said capillary above said bump, bonding said wire, which is wire-bonded to said first conductor and passes through said penetrating hole of said capillary, to said wire extending from said bump, and cutting said wire passing through said penetrating hole at a portion bonded to said wire extending from said bump, wherein said wire extending from said bump has a bent portion, said capillary is moved to receive said bent portion of said wire into said penetrating hole and to push said bent portion onto a wire inside said penetrating hole by an inner wall of said penetrating hole, thereby bonding said wire inside said penetrating hold to said bent portion of said wire extending from said bump in said secondary bonding.

8. A wire bonding method for wire bonding a first conductor and a second conductor, said wire bonding method comprising:

forming a bump on said second conductor by forming a ball at a tip of a wire and ball bonding said ball thereto;

wedge bonding a wire extending from said bump so that said wire is bonded onto one of said bump and said second conductor;

primary bonding said first conductor; and secondary bonding said second conductor by looping a wire bonded to said first conductor toward said bump and bonding said wire to said bump, wherein:

said wedge bonding is carried out so that said wire bonded onto one of said bump and said second conductor has a bent portion; and said secondary bonding includes:

moving said wire bonded to said first conductor toward said bent portion of said wire bonded to either one of said bump and said second conductor, using a capillary with a penetrating hole from which said wire bonded to said first conductor protrudes;

inserting said bent portion into said penetrating hole; and bonding said wire protruding from said penetrating hole to said bent portion by an inner wall of said penetrating hole.

9. The wire bonding method as claimed in claim 8, wherein said wedge bonding is carried out on a side of said bump opposite from said first conductor and at an angle from a center of said bump within a range of ±90° with respect to a direction in which said wire is looped.

10. The wire bonding method as claimed in claim 8, wherein said wedge bonding is carried out on a side of said bump opposite from said first conductor and at an angle from a center of said bump within a range of ±45° with respect to a direction in which said wire is looped.

11. The wire bonding method as claimed in claim 8, wherein said wedge bonding is carried out at a distance of at least 125 $\mu$m from a center of said bump.

12. The wire bonding method as claimed in claim 5, wherein said secondary bonding is carried out at a distance 0 $\mu$m to 20 $\mu$m from said center of said bump.

13. The wire bonding method as claimed in claim 12, wherein said wedge bonding is carried out on a side of said bump opposite from said first conductor and at an angle from a center of said bump within a range of ±45° with respect to a direction in which said wire is looped.

* * * * *